(12) United States Patent
Raj et al.

(10) Patent No.: US 9,742,380 B1
(45) Date of Patent: Aug. 22, 2017

(54) PHASE-LOCKED LOOP HAVING SAMPLING PHASE DETECTOR

(71) Applicant: Xilinx, Inc., San Jose, CA (US)

(72) Inventors: Mayank Raj, San Jose, CA (US); Parag Upadhyaya, Los Gatos, CA (US); Adebabay M. Bekele, San Jose, CA (US)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 15/170,797

(22) Filed: Jun. 1, 2016

(51) Int. Cl.
| | |
|---|---|
| H03L 7/06 | (2006.01) |
| H03K 3/013 | (2006.01) |
| H03K 5/04 | (2006.01) |
| H03K 7/08 | (2006.01) |
| H03L 7/18 | (2006.01) |
| H03L 7/197 | (2006.01) |
| H03L 7/093 | (2006.01) |
| H03L 7/091 | (2006.01) |
| H03L 7/089 | (2006.01) |

(52) U.S. Cl.
CPC ............. *H03K 3/013* (2013.01); *H03K 5/04* (2013.01); *H03K 7/08* (2013.01); *H03L 7/0891* (2013.01); *H03L 7/091* (2013.01); *H03L 7/093* (2013.01); *H03L 7/18* (2013.01); *H03L 7/1974* (2013.01)

(58) Field of Classification Search
CPC ....... H03L 7/08; H03L 7/0802; H03L 7/0805; H03L 7/0807; H03L 7/083; H03L 7/085; H03L 7/093; H03L 7/095; H03L 7/097; H03L 7/099; H03L 7/10; H03L 7/14; H03L 7/16; H03L 7/18; H03L 7/20; H03L 7/089; H03L 7/0891; H03L 7/0893; H03L 7/0895; H03L 7/0896; H03L 7/0898

USPC .................................................. 327/156–159
See application file for complete search history.

(56) References Cited

U.S. PATENT DOCUMENTS 7,737,743 B1 * 6/2010 Gao ................... H03L 7/087
327/156

OTHER PUBLICATIONS

Gao, Xiang et al., "A Low Noise Sub-Sampling PLL in Which Divider Noise is Eliminated and PD/CP Noise is Not Multiplied by N2," IEEE Journal of Solid-State Circuits, Dec. 2009, pp. 3253-3263, vol. 44, No. 12, IEEE, Piscataway, New Jersey, USA.
Hsu, Chun-Wei et al., "A 2.2GHz PLL using a Phase-Frequency Detector with an Auxiliary Sub-Sampling Phase Detector for In-Band Noise Suppression," Proc. of the 2011 IEEE Custom Integrated Circuits Conference, Sep. 19, 2011, pp. 1-4, IEEE, Piscataway, New Jersey, USA.

(Continued)

*Primary Examiner* — Lincoln Donovan
*Assistant Examiner* — Diana J Cheng
(74) *Attorney, Agent, or Firm* — Robert M. Brush

(57) ABSTRACT

An example a phase-locked loop (PLL) circuit includes a sampling phase detector configured to receive a reference clock and a feedback clock and configured to supply a first control current and a pulse signal. The PLL further includes a charge pump configured to generate a second control current based on the first control current and the pulse signal. The PLL further includes a loop filter configured to filter the second control current and generate an oscillator control voltage. The PLL further includes a voltage controlled oscillator (VCO) configured to generate an output clock based on the oscillator control voltage. The PLL further includes a frequency divider configured to generate the reference clock from the output clock.

20 Claims, 6 Drawing Sheets

(56) References Cited

OTHER PUBLICATIONS

Raczkowski, Kuba et al., "A 92-12.7 GHz Wideband Fractional-N Subsampling PLL in 28 nm CMOS with 280 fs RMS Jitter," IEEE Journal Solid-State Circuits, May 2015, pp. 1203-1213, vol. 50, No. 5, IEEE, Piscataway, New Jersey, USA.

* cited by examiner

PHASE-LOCKED LOOP HAVING SAMPLING PHASE DETECTOR

TECHNICAL FIELD

Examples of the present disclosure generally relate to electronic circuits and, in particular, to a phase-locked loop (PLL) having a sampling phase detector.

BACKGROUND

The in-band jitter contribution of a phase-locked loop (PLL) is dominated by phase detector and charge pump noise. This jitter contribution is reduced by increasing the effective gain of the phase detector and the charge pump. The effective gain can be increased by increasing charge pump current. However, increasing charge pump current results in higher power consumption and higher output noise. Additionally, the charge pump current cannot be increased arbitrarily due to saturation margin limits of the current sources, particularly in scaled processes with lower-voltage power supplies. Thus, it is desirable to increase the effective gain without increasing the charge pump current.

SUMMARY

Techniques for providing a phase-locked loop (PLL) having a sampling phase detector are described. In an example, a phase-locked loop (PLL) circuit includes a sampling phase detector configured to receive a reference clock and a feedback clock and configured to supply a first control current and a pulse signal. The PLL further includes a charge pump configured to generate a second control current based on the first control current and the pulse signal. The PLL further includes a loop filter configured to filter the second control current and generate an oscillator control voltage. The PLL further includes a voltage controlled oscillator (VCO) configured to generate an output clock based on the oscillator control voltage. The PLL further includes a frequency divider configured to generate the reference clock from the output clock.

In another example, a phase-locked loop (PLL) system includes a PLL and a control circuit. The PLL includes a sampling phase detector configured to receive a reference clock and a feedback clock and configured to supply a first control current and a pulse signal. The PLL further includes a charge pump configured to generate a second control current based on the first control current and the pulse signal. The PLL further includes a loop filter configured to filter the second control current and generate an oscillator control voltage. The PLL further includes a voltage controlled oscillator (VCO) configured to generate an output clock based on the oscillator control voltage. The PLL further includes a frequency divider configured to generate the reference clock from the output clock. The PLL system further includes a control circuit, coupled to the PLL, configured to control at least one of a slew rate, a pulse width, or a gain of the sampling phase detector.

In another example, a method of controlling a sampling phase detector in a phase-locked loop (PLL) circuit includes adjusting a slew rate of a feedback clock being sampled by a sampler of the sampling phase detector based on a reference clock, the feedback clock generated by dividing an output clock of a voltage controlled oscillator (VCO) of the PLL. The method further includes adjusting a pulse width of pulses used to control switches of a charge pump of the PLL. The method further includes adjusting gain of a transconductance circuit used to convert voltage output by the sampler to a current for controlling the charge pump.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
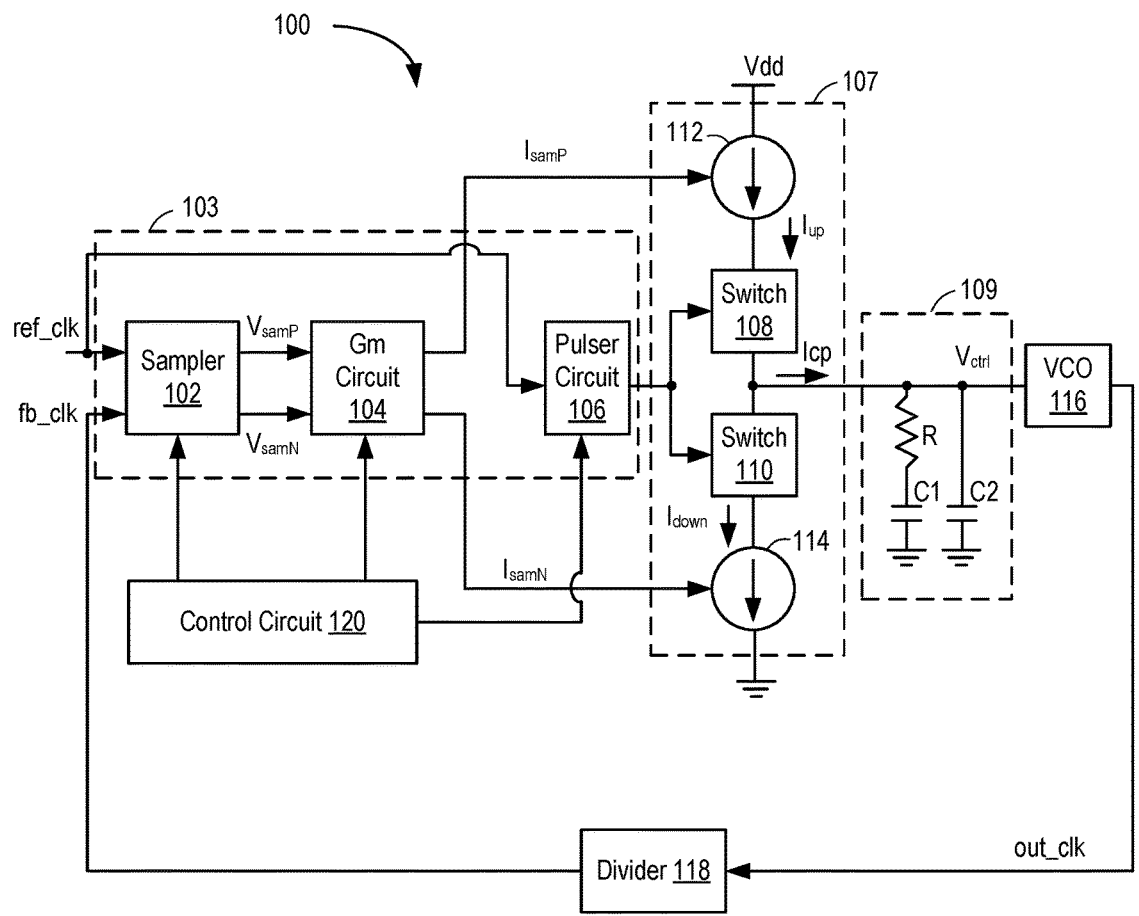
FIG. 1 is a block diagram depicting a phase-locked loop (PLL) according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

Techniques for providing a phase-locked loop (PLL) having a sampling phase detector are described. As discussed above, the in-band jitter contribution of a PLL is reduced by increasing the effective gain of the phase detector and the charge pump. The effective gain can be increased by using a sub-sampling phase detector. The sub-sampling detector realizes higher gain by directly sampling the output of the voltage controlled oscillator (VCO). However, this technique has several drawbacks. Sampling the VCO output directly exhibits higher power consumption due to the higher frequency of operation. Moreover, this technique has a small locking range and is prone to locking to harmonics requiring a separate frequency calibration circuit. Finally, the sub-sampling technique cannot be used for fractional synthesis without using complex digital-to-time converter circuits.

In examples described herein, a PLL includes a sampling phase detector that increases the effective gain of the phase detector and charge pump combination, thereby reducing the in-band jitter contribution of the PLL. Contrary to the sub-sampling phase detector described above, the sampling phase detector does not sample the VCO output directly. Rather, the sampling phase detector operates on a frequency-divided output of the VCO. The sampled output undergoes a voltage-to-current conversion in a transconductance (Gm) cell. The output of the Gm cell is used to control up and down currents of the charge pump. A pulser circuit is used to control the gain of the sampling phase detector. The structure of the sampling phase detector described herein increases locking range while reducing the power consumption and improving jitter performance. These and other aspects are described below with respect to the drawings.

FIG. 1 is a block diagram depicting a PLL 100 according to an example. The PLL 100 includes a sampler 102, a transconductance (Gm) circuit 104, a pulser circuit ("pulser 106"), a charge pump 107, a loop filter 109, a voltage controlled oscillator (VCO) 116, and a frequency divider ("divider 118"). In an example, the charge pump 107 includes a current source 112, switches 108 and 110, and a current source 114. In an example, the loop filter 109 includes a resistor R and capacitors C1 and C2. The PLL 100 includes a plurality of control inputs. In an example, the PLL 100 is coupled to a control circuit 120 that is configured to drive the control inputs. The sampler 102, the Gm circuit 104, and the pulser circuit 106 implement a sampling phase detector (SPD) 103.

The sampler 102 includes a pair of inputs configured to receive a reference clock (ref_clk) and a feedback clock (fb_clk), respectively. The sampler 102 includes a pair of outputs coupled to a pair of inputs of the Gm circuit 104. The outputs of the sampler 102 supply a differential voltage having a positive end ($V_{samP}$) and a negative end ($V_{samN}$). The Gm circuit 104 includes a pair of outputs coupled to a pair of inputs of the charge pump 107. The outputs of the Gm circuit 104 supply a differential current having a positive end ($I_{samP}$) and a negative end ($I_{samN}$). An example of the sampler 102 is described below with respect to FIG. 2. An example of the Gm circuit 104 is described below with respect to FIG. 4.

An input of the pulser circuit 106 is configured to receive the reference clock. An output of the pulser circuit 106 is coupled to an input of the charge pump 107. An output of the charge pump 107 is coupled to an input of the VCO 116. The output of the charge pump 107 supplies a current Icp. The loop filter 109 is coupled between the output of the charge pump 107 and a reference voltage (e.g., electrical ground). The loop filter 109 generates a voltage $V_{ctrl}$ in response to the current Icp. An input of the VCO 116 receives the control voltage $V_{ctrl}$. An output of the VCO 116 is coupled to an input of the divider 118. The output of the VCO 116 provides an output clock (out_clk). An output of the divider 118 is coupled to the sampler 102 to provide the reference clock. Control inputs of the sampler 102, the Gm circuit 104, and the pulser circuit 106 are coupled to outputs of the control circuit 120. An example of the pulser circuit 106 is described below with respect to FIG. 3. The VCO 116 can be an inductor-capacitor (LC) oscillator, ring oscillator, or the like. The divider 118 can be an integer divider (e.g., divide by N) or fractional divider (e.g., divide by N·F).

In an example, the current source 112 is selectively coupled between a supply voltage (Vdd) and the node $V_{ctrl}$ through the switch 108. The current source 114 is coupled between the node $V_{ctrl}$ and the reference voltage through the switch 110. Control inputs of the switches 108 and 110 are coupled to the output of the pulser 106. Outputs of the switches 108 and 110 supply the current Icp, which is converted to the voltage $V_{ctrl}$ by the loop filter 109. A control input of the current source 112 is coupled to receive the current $I_{samP}$ from the Gm circuit 104. A control input of the current source 114 is coupled to receive the current $I_{samN}$ from the Gm circuit 104. The current sources 112 and 114 can be any know circuits for implementing current-controlled current sources. The switches 108 and 110 can be any known circuits for implementing voltage-controlled switches.

In an example, the resistor R coupled in series with the capacitor C1. The series combination of the resistor R and the capacitor C1 is coupled between the node $V_{ctrl}$ and the reference voltage. The capacitor C2 is coupled in parallel with the series combination of the resistor R and C1. Hence, the capacitor C2 is coupled between the node $V_{ctrl}$ and the reference voltage. Those skilled in the art will appreciate that the loop filter 109 can have other known architectures for filtering a current to generate a voltage for controlling the VCO 116.

In operation, the SPD 103 operates on the divided feedback clock, rather than the output clock. In particular, the sampler 102 samples the feedback clock using the reference clock. The differential voltage output by the sampler 102 contains the phase error information (e.g., the phase error between the feedback clock and the reference clock). The Gm circuit 104 converts the differential voltage output by the sampler 102 into a differential current. The differential current is supplied to the charge pump 107, which controls the $I_{up}$ and $I_{down}$ currents supplied by the current sources 112 and 114 for phase locking. The pulser circuit 106 controls the switches 108 and 110 to be on or off concurrently, with the duration of the on state of the switches 108 and 110 being determined by the pulse width. The output current Icp is thus $I_{up}$–$I_{down}$ or zero depending on whether the switches 108 and 110 are closed or open, respectively. The single-ended output current Icp of the charge pump is filtered by the loop filter 109, which generates the control voltage Vctrl for the VCO 116. While the charge pump 107 is shown as supplying a single-ended output, in other examples, the charge pump 107 can have a differential output. Further, in other examples, the number of branches in the charge pump 107 can be changed to increase or decrease the charge pump current.

The gain of the SPD 103 is:

$$K_{SPD}=(S_{rw} \times t_{pul} \times G_M)/2\pi \qquad \text{Eq. 1,}$$

Where $S_{rw}$ is the slew-rate of the feedback clock, $t_{pul}$ is the pulse width of the output of the pulser circuit 106, and $G_m$ is the effective transconductance of the Gm circuit 104. By varying the parameters $S_{rw}$, $t_{pul}$, and $G_m$, the gain of the SPD 103 can be controlled to be greater than Icp/2π. In addition, increasing the gain of the SPD 103 by increasing $S_{rw}$ does not change the output noise. Hence, doubling the gain of the SPD 103 yields a 6 decibel (dB) phase noise improvement of the PLL 100 output, which is 3 dB better than the conventional approach of increasing the charge pump output current. Further, the SPD 103 consumes less power than a sub-sampling phase detector architecture that directly samples the output of the VCO due to the lower frequency of operation of the SPD 103. Further, the SPD 103 is not prone to locking to harmonics, as both the reference and feedback clocks are at the same frequency, which simplifies the architecture as compared to the sub-sampling phase detector. Moreover, the SPD 103 can be used with fractional synthesis.

Figure 7:
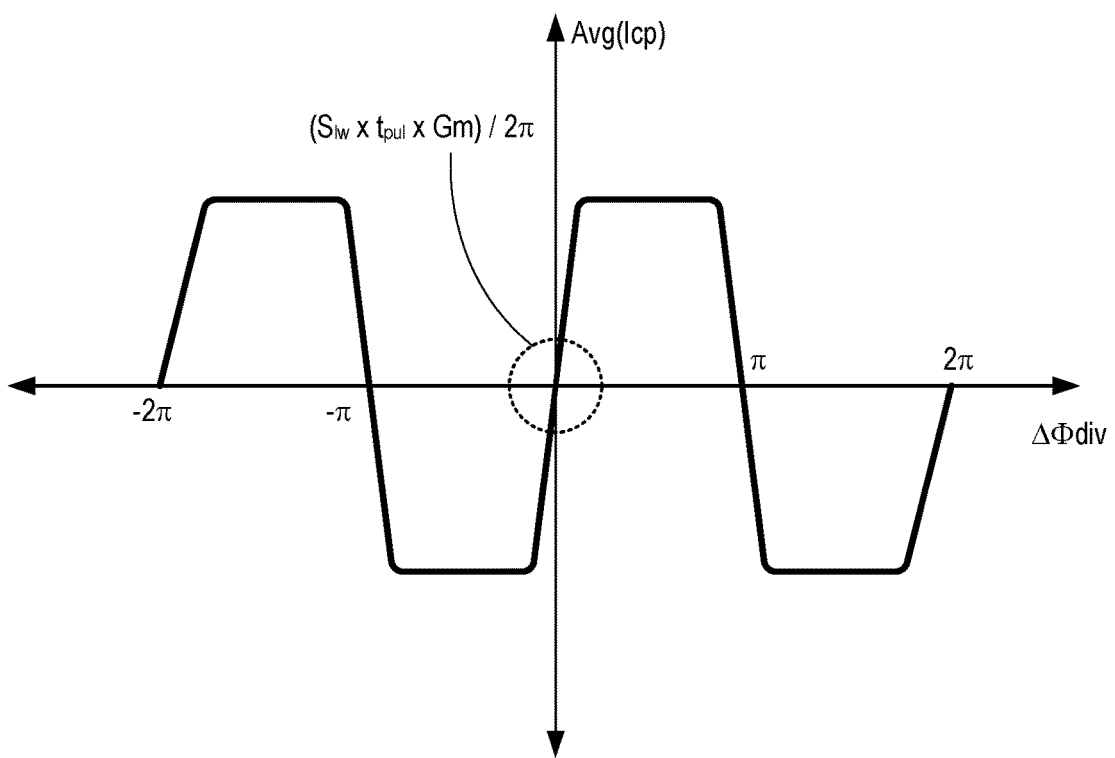
FIG. 7 is a graph depicting a characteristic of a sampling phase detector according to an example.

FIG. 7 is a graph 700 depicting a characteristic of the SPD 103 according to an example. The graph 700 includes an X-axis representing a change in phase and a Y-axis representing the average charge pump output current Icp. The curve shows how the charge pump output current varies according to the phase difference between the feedback clock and the reference clock. The slope of the curve between maximum Icp and minimum Icp (i.e., the gain of the SPD 103) is the value shown by Equation 1 above. It is apparent that the slope of the curve can be varied by varying one or more of $S_{lw}$, $t_{pul}$, and $G_m$.

Figure 2:
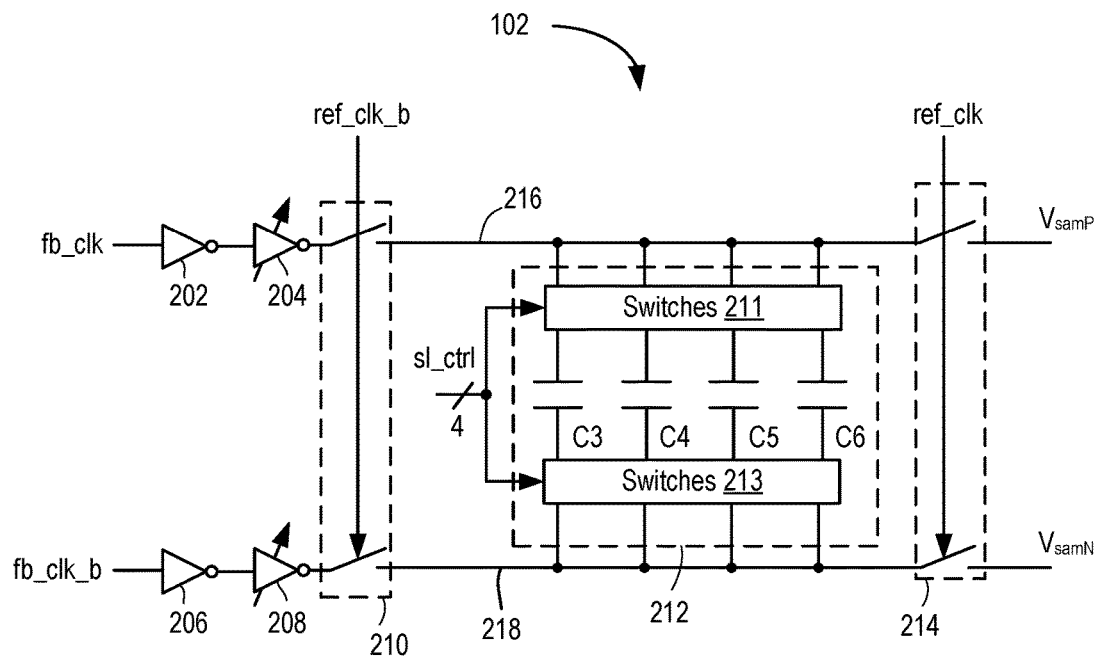
FIG. 2 is a schematic diagram depicting a sampler according to an example.

FIG. 2 is a schematic diagram depicting the sampler 102 according to an example. In the example, the sampler 102 includes inverters 202, 204, 206, and 208. The sampler 102 further includes a switch circuit 210, a switched capacitor bank 212, and a switch circuit 214. In the example, the switched capacitor bank 212 includes switches 211, capacitors C3, C4, C5, and C6, and switches 213. While the switched capacitor bank 212 is shown as having four capacitors, in general the switched capacitor bank 212 provides a variable capacitance using a plurality of capacitors.

An input of the inverter 202 receives the feedback clock (fb_clk). An output of the inverter 202 is coupled to an input of the inverter 204. An output of the inverter 204 is coupled to a node 216 through a switch in the switch circuit 210. An input of the inverter 206 receives a logical complement of the feedback clock (fb_clk_b). An output of the inverter 206 is coupled to an input of the inverter 208. An output of the inverter 208 is coupled to a node 218 through a switch in the switch circuit 210. Control inputs of the switches in the switch circuit 210 are coupled to receive the complement of the reference clock (ref_clk_b).

The switched capacitor bank 212 is coupled between the nodes 216 and 218. In the example, the capacitors C3-C6 are coupled in parallel between the switches 211 and the switches 213. The switches 211 selectively couple the capacitors C3-C6 to the node 216. The switches 213 selectively couple the capacitors C3-C6 to the node 218. Control inputs of the switches 211 and 213 receive a control signal (sl_ctrl). In the example, the control signal (sl_ctrl) has a width of four bits. The control signal (sl_ctrl) can control the switches 211 and 213 to select among 15 different capacitances provided by different ones of the capacitors C3-C6 and different parallel combinations of the capacitors C3-C6. The capacitors C3-C6 can have different capacitance values. For example, the capacitor C4 can have twice the capacitance of the capacitor C3; the capacitor C5 can have twice the capacitance of the capacitor C4; and the capacitor C6 can have twice the capacitance of the capacitor C5.

The node 216 selectively supplies the voltage $V_{samP}$ through a switch in the switch circuit 214. The node 218 selectively supplies the voltage $V_{samN}$ through a switch in the switch circuit 214. The switches in the switch circuit 214 are controlled by the reference clock (ref_clk).

In operation, the control signal sl_ctrl is used to control the slew rate ($S_{lw}$) of the feedback clock and hence control the gain of the SPD 103. To increase the gain of the SPD 103, the control signal sl_ctrl can supply a lower digital code to reduce the amount of capacitance supplied by the switched capacitor bank 212. To decrease the gain of the SPD 103, the control signal sl_ctrl can supply a higher digital code to increase the amount of capacitance supplied by the switched capacitor bank 212. The inventors 204 and 208 can have a programmable skew to control the common mode of the Gm circuit 104. The control circuit 120 can supply the control signal sl_ctrl, as well as signals for controlling the skew of the inverters 204 and 208.

Figure 3:
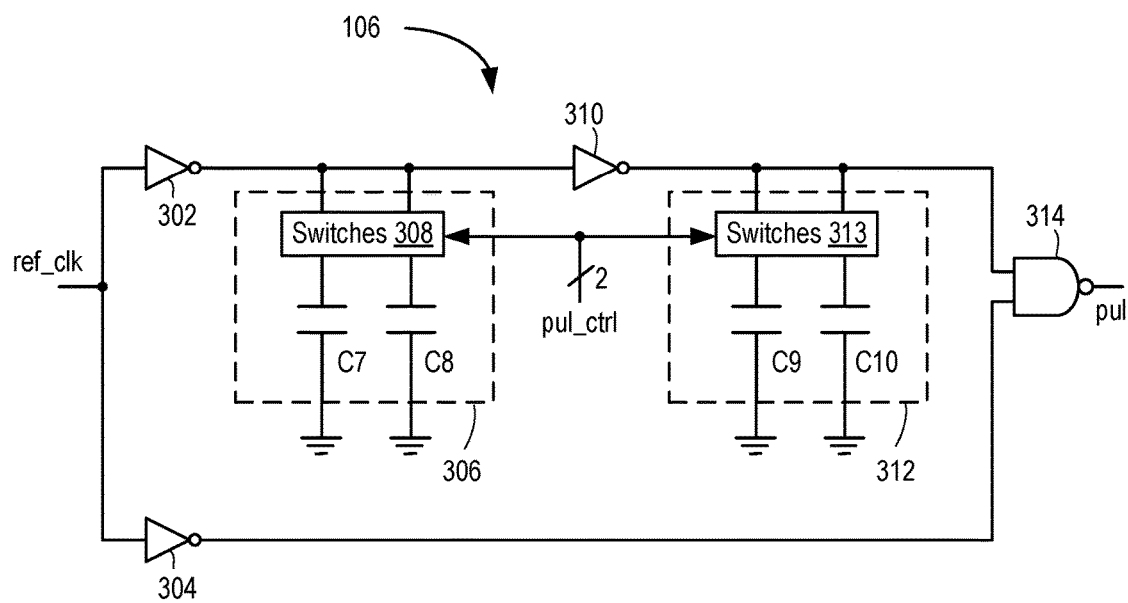
FIG. 3 is a schematic diagram depicting a pulser circuit according to an example.

FIG. 3 is a schematic diagram depicting the pulser circuit 106 according to an example. In the example, the pulser circuit 106 includes inverters 302, 304, and 310. The pulser circuit 106 further includes switched capacitor banks 306 and 312. The pulser circuit 106 further includes a logic gate 314 configured to provide a logical NAND function (e.g., a NAND gate or combination of gates providing a NAND function).

Inputs of the inverters 302 and 304 receive the reference clock (ref_clk). An output of the inverter 302 is coupled to an input of the inverter 310. An output of the inverter 310 is coupled to an input of the logic gate 314. An output of the inverter 304 is coupled to another input of the logic gate 314. An output of the logic gate 314 provides a pulse signal (pul).

The switched capacitor bank 306 is coupled between the output of the inverter 302 and a reference voltage (e.g., electrical ground). Likewise, the switched capacitor bank 312 is coupled between the output of the inverter 310 and the reference voltage. The switched capacitor bank 306 includes switches 308 and capacitors C7 and C8. The capacitors C7 and C8 are coupled in parallel between the switches 308 and the reference voltage. The capacitors C7 and C8 are selectively coupled to the output of the inverter 302 through the switches 308. The switched capacitor bank 312 is configured similarly to the switched capacitor bank 306. In particular, the switched capacitor bank 312 includes switches 313 and capacitors C9 and C10. The capacitors C9 and C10 are coupled in parallel between the switches 313 and the reference voltage. The capacitors C9 and C10 are selectively coupled to the output of the inverter 310 through the switches 313. Control inputs of the switches 308 each receive a pulse control signal (pul_ctrl). While each of the switched capacitor banks 306 and 312 is shown as having two capacitors, in general each of the switched capacitor banks 306 and 312 provides a variable capacitance using a plurality of capacitors.

In operation, the pulser circuit 106 delays the reference clock along parallel paths: one path through the inverters 302 and 310 and another path through the inverter 304. The difference in delay of the two paths is the effective pulse width. The signal pul_ctrl can be used to increase or decrease capacitance supplied by the switched capacitor banks 306 and 312 thereby increasing or decreasing the pulse width $t_{pul}$. Increasing the capacitance increases the delay of the path through the inverters 302 and 310 and decreasing the capacitance decreases the delay of the path through the inverters 302 and 310. An increased pulse width increases the gain of the SPD 103, and a decreased pulse width decreases the gain of the SPD 103. The pulse control signal pul_ctrl can be supplied by the control circuit 120.

Figure 4:
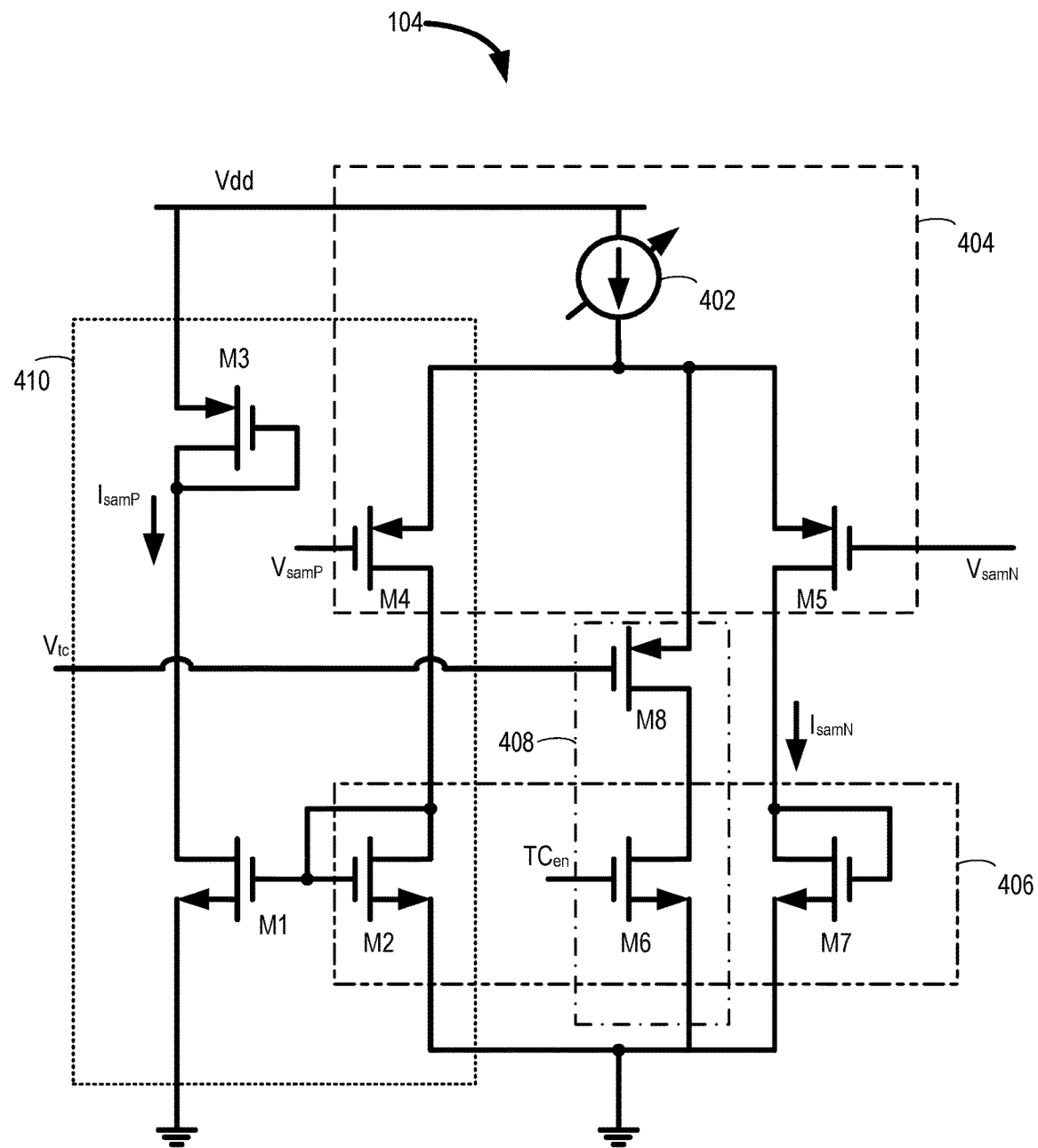
FIG. 4 is schematic diagram depicting a transconductance (Gm) circuit according to an example.

FIG. 4 is schematic diagram depicting the Gm circuit 104 according to an example. In the example, the Gm circuit 104 includes a variable current source 402 and transistors M1 through M8. The transistors M3, M4, M5, and M8 comprise P-channel field effect transistors (FETs), such as P-type metal oxide semiconductor FETs (MOSFETs). The transistors M1, M2, M6, and M7 comprise N-channel FETs, such as N-type MOSFETs.

A source of the transistor M3 is coupled to a voltage supply (Vdd). A gate of the transistor M3 is coupled to its source, which is in turn coupled to a drain of the transistor M1. The gate of the transistor M3 sources the current $I_{samP}$.

A source of the transistor M1 is coupled to a reference voltage (e.g., electrical ground). A gate of the transistor M1 is coupled to a gate of the transistor M2. The gate of the transistor M2 is also coupled to its drain. A source of the transistor M2 is coupled to the reference voltage.

A drain of the transistor M4 is coupled to the drain of the transistor M2. A gate of the transistor M2 receives the voltage $V_{samP}$. A source of the transistor M4 is coupled to an output of the variable current source 402. An input of the variable current source 402 is coupled to the supply voltage Vdd. A source of the transistor M5 is coupled to the output of the variable current source 402. A drain of the transistor M5 is coupled to a drain of the transistor M7. A gate of the transistor M5 is coupled to receive the voltage $V_{samN}$.

A gate of the transistor M7 is coupled to its drain. A source of the transistor M7 is coupled to the reference voltage. The gate of the transistor M7 supplies the current $I_{samN}$. A source of the transistor M8 is coupled to the output of the variable current source 402. A drain of the transistor M8 is coupled to a drain of the transistor M6. A gate of the transistor M8 receives a temperature control voltage ($V_{tc}$). A source of the transistor M6 is coupled to the reference voltage. A gate of the transistor M6 receives a temperature control enable signal ($TC_{en}$).

In operation, the variable current source 402 and the transistors M4 and M5 implement a differential amplifier 404 (p-channel based). The transistors M2 and M7 implement a diode-connected load (n-channel based). The transistors M1 and M2 and the variable current source 402 implement a current mirror 410 with the transistor M3 providing a diode-connected load. The current $I_{samP}$ is supplied by the drain of the transistor M3. The current $I_{samN}$ is provided by the drain of the transistor M5. The differential voltage $V_{samP}$ and $V_{samN}$ is coupled to the input of the differential amplifier 404 (e.g., to the gates of the transistors M4 and M5, respectively). The gain, $G_m$, of the Gm circuit 104 can be controlled by varying the bias current supplied by the variable current source 402. A control signal for controlling the variable current source 402 can be supplied by the control circuit 120.

The Gm circuit 104 also includes a current bleeder 408 implemented by the transistors M8 and M6. The transistor M6 receives the control signal $TC_{en}$, which enables or disables the current bleeder 408. The transistor M8 receives the control voltage $V_{tc}$, which controls the amount of current sinked by the current bleeder 408. The current bleeder 408 provides for temperature compensation. The control circuit 120 can include a temperature compensation circuit to generate the voltage $V_{tc}$. At low temperature, the control signal $V_{tc}$ is low and thus the current bleeder 408 is turned one, which reduces the gain $G_m$. At high temperature, the control signal $V_{tc}$ is high and thus the current bleeder 408 is turned off, which leaves the gain $G_m$ unaltered. Accordingly, the control circuit 120 can vary the voltage $V_{tc}$ as the temperature varies in order to achieve a substantially constant gain $G_m$ across the temperature range.

Figure 5:
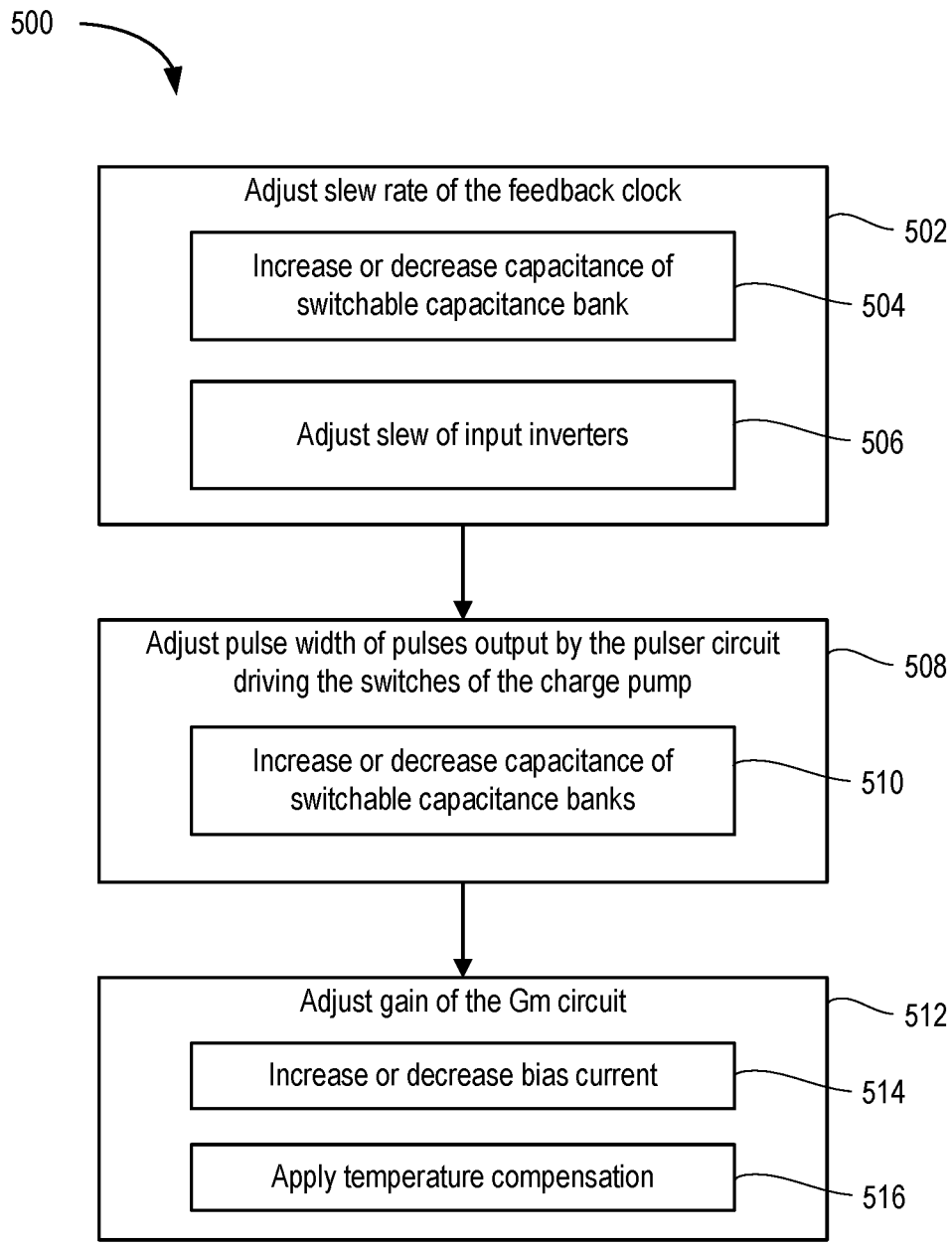
FIG. 5 is a flow diagram depicting a method of controlling the gain of a sampling phase detector according to an example.

FIG. 5 is a flow diagram depicting a method 500 of controlling the gain of the sampling phase detector 103 according to an example. The method 500 can be implemented by the control circuit 120 coupled to the PLL 100. The method 500 begins at block 502, where the control circuit 120 adjusts the slew rate of the feedback clock. In an example, at block 504, the control circuit 120 increases or decreases the capacitance of the switched capacitance bank 212 in the sampler 102. At block 506, the control circuit 120 adjusts the skew of the inverters 204 and 208 in the sampler 102.

At block 508, the control circuit 120 adjusts the pulse width of pulses output by the pulser circuit 106. In an example, at block 510, the control circuit 120 increases or decreases the capacitance supplied by the switched capacitance banks 306 and 312.

At block 512, the control circuit 120 adjusts the gain of the Gm circuit 104. In an example, at block 514, the control circuit 120 increases or decreases the bias current supplied by the variable current source 402. At block 516, the control circuit 120 applies temperature compensation in the form of a temperature control signal applied to a current bleeder 408 in the Gm circuit 104.

Figure 6:
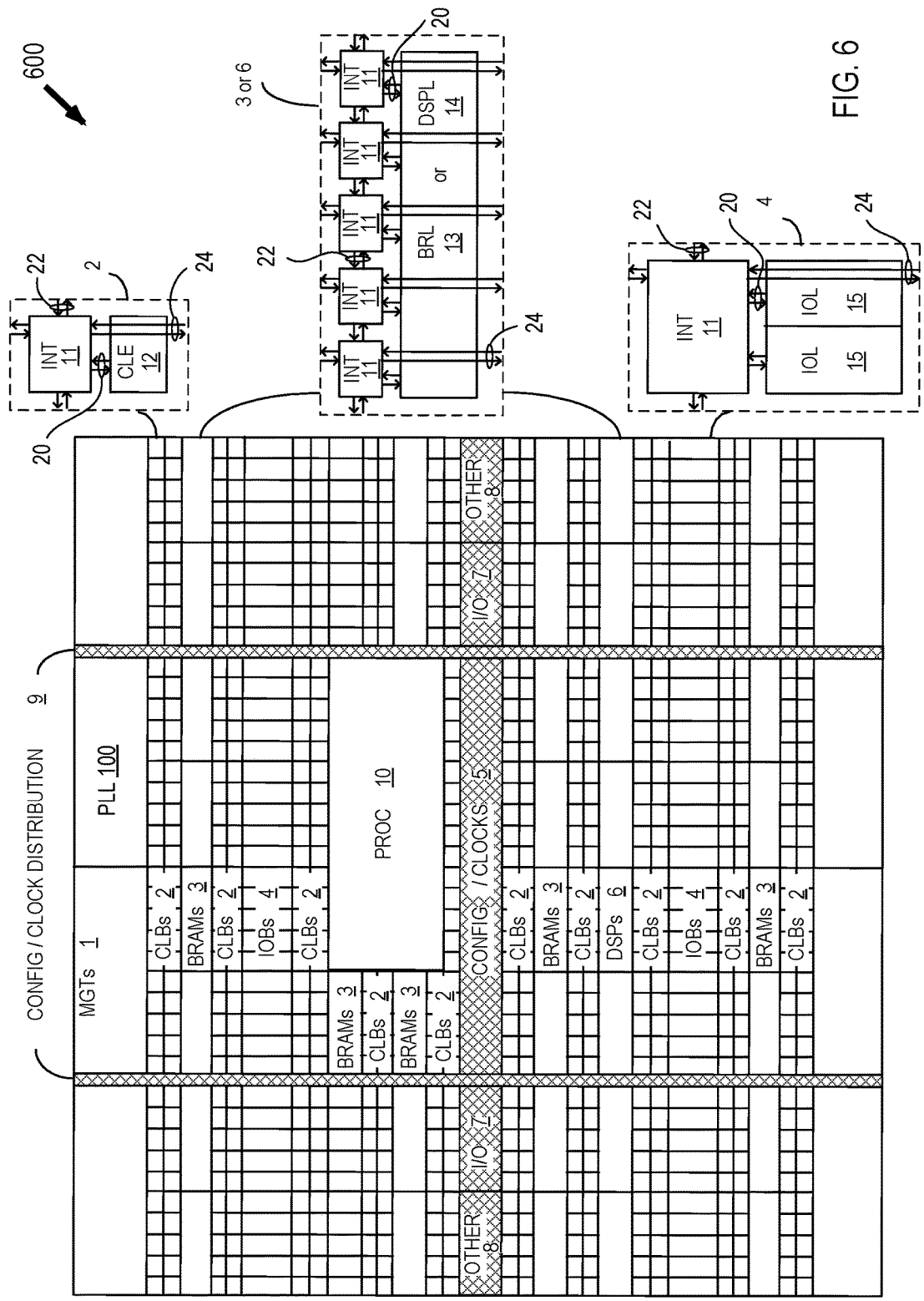
FIG. 6 illustrates an architecture of a programmable integrated circuit (IC) in which the PLL of FIG. 1 can be utilized.

The PLL 100 described herein can be used in receivers or transceivers disposed in an IC, such as a field programmable gate array (FPGA) or other type of programmable IC or in an application specific integrated circuit (ASIC). Although an FPGA is shown by way of example, it is to be understood that the PLL 100 can be implemented in other types of ICs or applications. FIG. 6 illustrates an architecture of an FPGA 600 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10.

In some FPGAs, each programmable tile can include at least one programmable interconnect element ("INT") 11 having connections to input and output terminals 20 of a programmable logic element within the same tile, as shown by examples included at the top of FIG. 11. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An 10B 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 11) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A phase-locked loop (PLL) circuit, comprising:
a sampling phase detector configured to receive a reference clock and a feedback clock and configured to supply a first control current and a pulse signal;
a charge pump configured to generate a second control current based on the first control current and the pulse signal;
a loop filter configured to filter the second control current and generate an oscillator control voltage;
a voltage controlled oscillator (VCO) configured to generate an output clock based on the oscillator control voltage; and
a frequency divider configured to generate the feedback clock from the output clock.

2. The PLL circuit of claim 1, wherein the sampling phase detector includes a first control input configured to receive a first control signal for adjusting a slew rate of the feedback clock, a second control input configured to receive a second control signal for adjusting a pulse width of the pulse signal, and a third control input configured to receive a third control signal for adjusting a gain used in the generation of the first control current.

3. The PLL circuit of claim 1, wherein the sampling phase detector comprises:
a sampler configured to sample the feedback clock using the reference clock to generate a control voltage;
a transconductance circuit configured to convert the control voltage to the first control current; and
a pulser circuit configured to generate the pulse signal in response to the reference clock.

4. The PLL circuit of claim 3, wherein the charge pump comprises:
a first current source selectively coupled between a supply voltage and a node providing the control voltage through a first switch;
a second current source selectively coupled between a reference voltage and the node providing the control voltage through a second switch;
wherein control inputs of the first and second switches are each coupled to receive the pulse signal; and
wherein control inputs of the first and second current sources are coupled to receive the first and second currents, respectively.

5. The PLL circuit of claim 3, wherein the sampler includes a switchable capacitor bank configured to increase or decrease capacitance at an output of the sampler based on a first control signal.

6. The PLL circuit of claim 5, wherein the sampler includes an inverter configurable to provide an increased or decreased skew to the feedback clock at an input of the sampler based on a second control signal.

7. The PLL circuit of claim 3, wherein the pulser circuit includes a switchable capacitor bank configured to increase or decrease capacitance of a path receiving the reference clock based on a control signal.

8. The PLL circuit of claim 3, wherein the transconductance circuit includes a variable current source providing a bias current to a differential amplifier based on a first control signal.

9. The PLL circuit of claim 8, wherein the transconductance circuit includes a bleeder circuit responsive to a second control signal.

10. A phase-locked loop (PLL) system, comprising:
a PLL including:
a sampling phase detector configured to receive a reference clock and a feedback clock and configured to supply a first control current and a pulse signal;
a charge pump configured to generate a second control current based on the first control current and the pulse signal;
a loop filter configured to filter the second control current and generate an oscillator control voltage;
a voltage controlled oscillator (VCO) configured to generate an output clock based on the oscillator control voltage; and
a frequency divider configured to generate the feedback clock from the output clock; and
a control circuit, coupled to the PLL, configured to control at least one of a slew rate, a pulse width, or a gain of the sampling phase detector.

11. The PLL system of claim 10, wherein the sampling phase detector includes a first control input configured to receive a first control signal from the control circuit for adjusting a slew rate of the feedback clock, a second control input configured to receive a second control signal from the control circuit for adjusting a pulse width of the pulse signal, and a third control input configured to receive a third control signal from the control circuit for adjusting a gain used in the generation of the first control current.

12. The PLL system of claim 10, wherein the sampling phase detector comprises:
a sampler configured to sample the feedback clock using the reference clock to generate a control voltage;
a transconductance circuit configured to convert the control voltage to the first control current; and
a pulser circuit configured to generate the pulse signal in response to the reference clock.

13. The PLL system of claim 12, wherein the charge pump comprises:

a first current source selectively coupled between a supply voltage and a node providing the control voltage through a first switch;

a second current source selectively coupled between a reference voltage and the node providing the control voltage through a second switch;

wherein control inputs of the first and second switches are each coupled to receive the pulse signal; and wherein control inputs of the first and second current sources are coupled to receive the first and second currents, respectively.

14. The PLL system of claim 12, wherein the sampler includes a switchable capacitor bank configured to increase or decrease capacitance at an output of the sampler based on a first control signal.

15. The PLL system of claim 14, wherein the sampler includes an inverter configurable to provide an increased or decreased skew to the feedback clock at an input of the sampler based on a second control signal.

16. The PLL system of claim 12, wherein the pulser circuit includes a switchable capacitor bank configured to increase or decrease capacitance of a path receiving the reference clock based on a control signal.

17. The PLL system of claim 12, wherein the transconductance circuit includes a variable current source providing a bias current to a differential amplifier based on a first control signal.

18. The PLL system of claim 17, wherein the transconductance circuit includes a bleeder circuit responsive to a second control signal.

19. A method of controlling a sampling phase detector in a phase-locked loop (PLL) circuit, comprises:

adjusting a slew rate of a feedback clock being sampled by a sampler of the sampling phase detector based on a reference clock, the feedback clock generated by dividing an output clock of a voltage controlled oscillator (VCO) of the PLL;

adjusting a pulse width of pulses used to control switches of a charge pump of the PLL; and adjusting gain of a transconductance circuit used to convert voltage output by the sampler to a current for controlling the charge pump.

20. The method of claim 19, wherein the step of adjusting the gain of the transconductance circuit comprises:

increasing or decreasing bias current supplied to a differential amplifier in the transconductance circuit; and selectively sinking current in a bleeder circuit in response to a temperature control signal.

\* \* \* \* \*